United States Patent [19]

McCartney et al.

[11] Patent Number: 4,940,947

[45] Date of Patent: Jul. 10, 1990

[54] LINE NOISE SIGNAL MEASUREMENT SYSTEM USING ANALOG SIGNAL COMPRESSION WITH DIGITAL LINEARITY CORRECTION

[75] Inventors: Andrew McCartney, Libertyville; Thomas McCartney, Bannockburn, both of Ill.

[73] Assignee: Oneac Corporation, Libertyville, Ill.

[21] Appl. No.: 316,798

[22] Filed: Feb. 28, 1989

[51] Int. Cl.$^5$ ............................................ G01R 29/26
[52] U.S. Cl. ..................... 324/613; 324/77 A; 333/14; 381/106
[58] Field of Search ............... 324/57 N, 475, 102, 324/77 A, 613, 614; 333/14; 330/110; 379/24, 22, 27, 416, 1; 381/31, 106; 364/574, 571.01, 572

[56] References Cited

U.S. PATENT DOCUMENTS

| | | | |
|---|---|---|---|
| 4,002,969 | 1/1977 | Barley et al. | 324/57 N |
| 4,119,922 | 10/1978 | Schröder | 330/110 X |
| 4,187,461 | 2/1980 | Cox | 324/102 |
| 4,206,413 | 6/1980 | Cox et al. | 328/127 |
| 4,271,332 | 6/1981 | Anderson | 330/110 X |
| 4,414,638 | 11/1983 | Talambiras | 364/571 |
| 4,414,639 | 11/1983 | Talambiras | 364/602 |
| 4,462,008 | 7/1984 | Katakura | 333/14 |
| 4,628,277 | 12/1986 | Hill et al. | 330/110 |
| 4,642,563 | 2/1987 | McEachern et al. | 324/111 |
| 4,694,402 | 9/1987 | McEachern et al. | 364/487 |
| 4,696,057 | 9/1987 | Otani | 324/57 N X |
| 4,761,816 | 8/1988 | Fukasawa | 381/106 |

Primary Examiner—Reinhard J. Eisenzopf
Assistant Examiner—Robert W. Mueller
Attorney, Agent, or Firm—Mason, Kolehmainen, Rathburn & Wyss

[57] ABSTRACT

A line noise signal measurement system is provided with detecting circuitry for providing a sensed analog signal. Compression circuitry is coupled to the detecting circuitry for providing an amplitude compressed signal responsive to the applied sensed signal. The compression circuitry has a stepwise substantially linear transfer function responsive to a variable magnitude of the applied sensed signal. Signal processing circuitry is coupled to the compression circuitry for sequentially generating a digital signal representative of the sensed analog signal. Digital processing circuitry sequentially identifies a maximum peak signal for a predetermined time interval and provides linearity correction for the identified maximum peak signals and generates a display of the corrected peak signals.

18 Claims, 1 Drawing Sheet

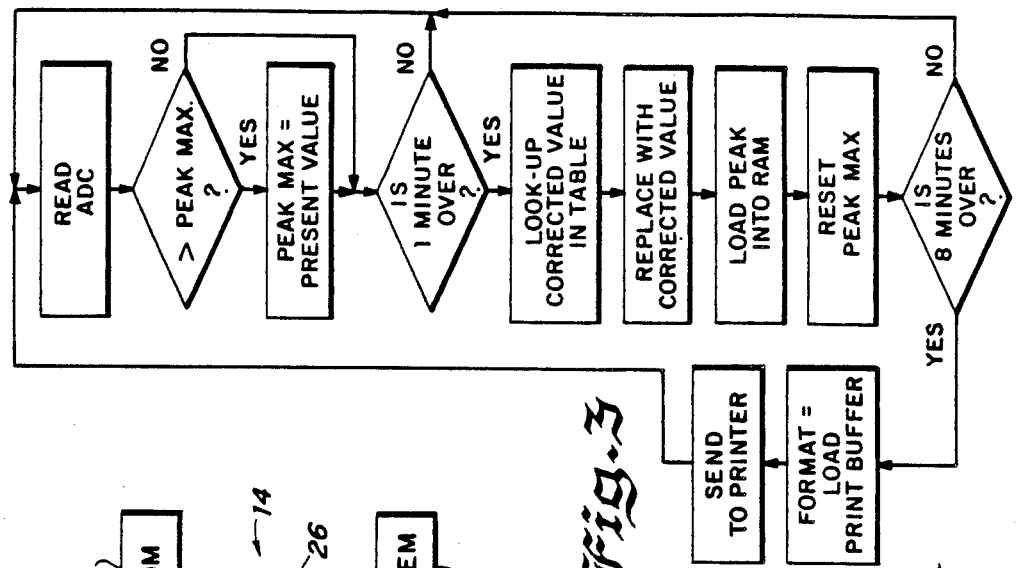
Fig-3
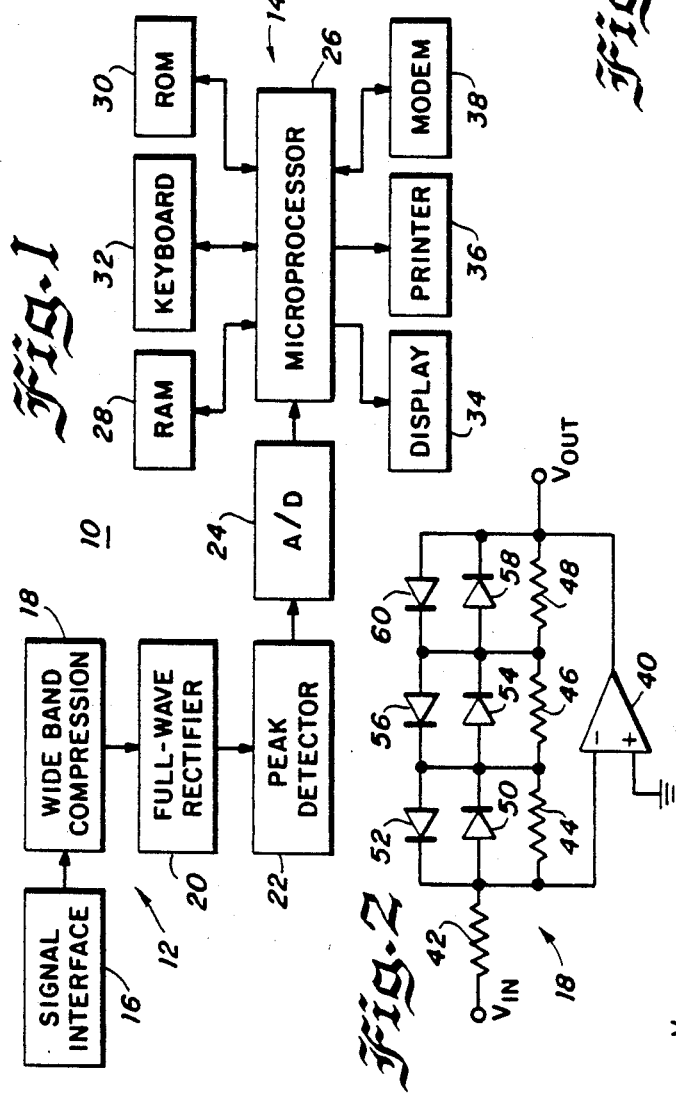
Fig-1
Fig-2
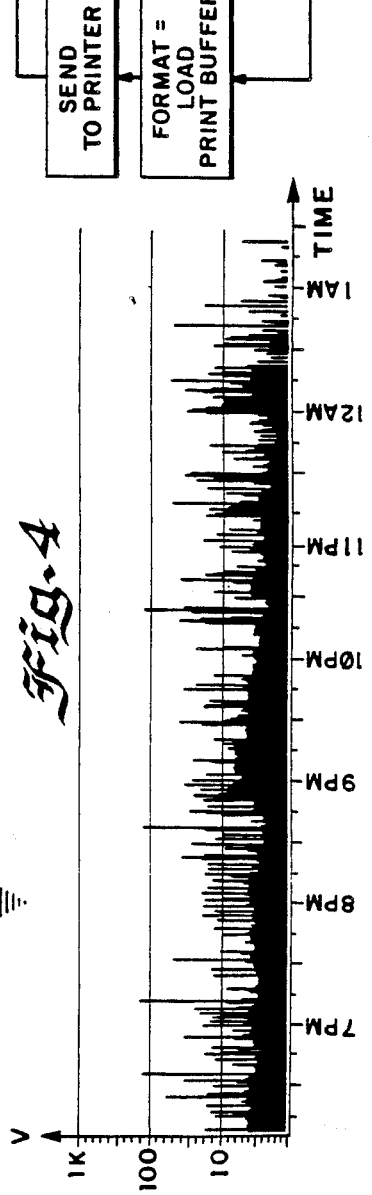
Fig-4

LINE NOISE SIGNAL MEASUREMENT SYSTEM USING ANALOG SIGNAL COMPRESSION WITH DIGITAL LINEARITY CORRECTION

BACKGROUND OF THE INVENTION

1. Related Application

A related application is entitled "POWER LINE WAVEFORM MEASUREMENT SYSTEM", Ser. No. 316,936, filed Feb. 28, 1989, the same date as the present application by Andrew McCartney et al. and assigned to the same assignee.

2. Field of the Invention

The present invention relates generally to signal measurement systems, and more particularly to a line noise signal measurement and recording system utilizing analog compression circuitry with digital linearity correction.

3. Description of the Prior Art

Various arrangements have been used for measuring impulse and transient disturbances appearing on power lines and recording the collected information. Disadvantages of known arrangements generally include the complexity and the resulting expense of the circuitry utilized. Further the recorded information provided by many known arrangements results in an extremely extensive amount of data that is difficult to analyze.

It is desirable to provide a signal measurement and recording system capable of simply and effectively measuring noise and transient disturbances signals on AC power lines or other lines and reporting the measured signals.

Summary of the Invention

A principal object of the present invention is to provide an improved line noise measurement system that overcomes many of the disadvantages of the prior art systems.

It is another object of the present invention to provide an improved line noise measurement system including a wide bandwidth compression circuit for processing a detected analog signal.

It is another object of the present invention to provide such system further including a digital processing circuit for providing digital linearity correction for the wide band compression circuit.

It is yet another object of the present invention to provide such system further with the digital processing circuit effective for generating a display of sequential peak voltage signals each for a selected time interval.

In brief, the objects and advantages of the present invention are achieved by a line noise signal measurement system comprising detecting circuitry for providing a sensed analog signal. Compression circuitry is coupled to the detecting circuitry for providing an amplitude compressed signal responsive to the applied sensed signal. The compression circuitry has a stepwise substantially linear transfer function responsive to a variable magnitude of the applied sensed signal. Signal processing circuitry is coupled to the compression circuitry for sequentially generating a digital signal representative of the sensed analog signal.

BRIEF DESCRIPTION OF THE DRAWINGS

The present invention together with the above and other objects and advantages may best be understood from the following detailed description of the embodiment of the invention illustrated in the drawings, wherein:

FIG. 1 is a block diagram representation of a signal measurement system in accordance with the principles of the present invention;

FIG. 2 is a schematic diagram representation of compression circuitry of the system of FIG. 1;

FIG. 3 is a flow chart illustrating the logical steps performed by the system of FIG. 1; and FIG. 4 is an exemplary chart illustrating a peak voltage signals display of the system of FIG. 1.

DETAILED DESCRIPTION OF THE PREFERRED EMBODIMENT

Referring now to the drawings, in FIG. 1 there is illustrated a signal measurement system according to the present invention generally designated by the reference character 10. The signal measurement system 10 can be used for detecting and recording noise and transient signals an AC power line, but it should be understood that the principles of the invention are not limited to this particular application.

As its major functional components, the signal measurement system 10 includes an analog signal detecting and processing circuit 12 and a digital signal processing and control circuit 14. The signal detecting and processing circuit 12 includes a signal interface circuit 16 for connection with the AC power lines, or other lines which are being monitored and for providing a sensed signal. An attenuation factor of the signal interface circuit 16 can be selectively provided, for example, such as 0.1 or 0.01, for providing the sensed signal amplitude in a selected range, for example, of ±100 volts.

A compression circuit 18 is connected to the interface circuit 16 for receiving the sensed signal and for providing an amplitude compressed signal. The amplitude compressed signal output of the compression circuit 18 can be provided in a selected range, for example, between ±2.5 volts. Both the signal interface circuit 16 and the compression circuit 18 are adapted to wide bandwidth and high slew rate response characteristics. A full-wave rectifier circuit 20 is connected to the compression circuit 20 for rectifying the compressed signal. The rectified output of the full-wave rectifier circuit 20 is applied to a peak detector circuit 22.

A detected peak signal of the peak detector circuit 22 is applied to an analog to digital converter 24 for analog to digital conversion of the applied peak signal. A microprocessor 26 of the digital signal processing and control circuit 14 provides control signals to the A/D converter 24 and sequentially reads the digital word representing the present peak signal. An 8-bit analog to digital converter, such as an ADC0809 manufactured by National Semiconductor Corp., or various other commercially available devices can be used for the A/D converter 24.

Digital gain and linearity correction of the read digital peak word is provided by the microprocessor 26 performing a stored system program of the invention as described below with respect to FIG. 3. An 8-bit data, 16-bit address microprocessor, such as a device type Z80 microprocessor manufactured by Zilog Corp., can be utilized for the microprocessor 26, although a variety of commercially available microprocessors having standard capabilities could be used.

A random access memory (RAM) 28 and a read only memory (ROM) 30 can be associated with the microprocessor 26 for storing measured signal data, user selected parameter data and a system program. A keyboard 32 and a display 34 can be coupled to the microprocessor 26 to facilitate receiving user selected parameter data, such as selected time intervals for recording measured signal data and for displaying selected system indications. A printer 36 is coupled to the microprocessor 26 for printing the measured signal data. A modem 38 can be coupled to the microprocessor 26 to facilitate transmission of the measured signal data for recording and display at a remote location.

Referring now to FIG. 2, there is shown a schematic diagram representation of the compression circuit 18. The compression circuit 18 includes an operational amplifier 40 with a first resistor 42 connected to an inverting input of the operational amplifier. A plurality of resistors 44, 46, and 48 are connected in series between the inverting input and an output of the operational amplifier 40. A pair of oppositely poled semiconductor diodes 50 and 52 are connected in parallel across the first series resistor 44. A second pair of semiconductor diodes 54 and 56 are similarly connected in parallel across the second series resistor 46 and a third pair of semiconductor diodes 58 and 60 are similarly connected in parallel across the third series resistor 48.

An operational amplifier having wide bandwidth and high slew rate characteristics, such as, a device type LM318 manufactured by National Semiconductor Corp., or various other commercially available devices can be used for the operational amplifier 40.

The transfer function of the compression circuit 18 varies as a stepwise substantially linear function of the magnitude of the sensed signal applied at a point labelled Vin of the compression circuit 18. This transfer function is provided by the switching operation respective ones of the diode pairs 50 and 52, 54 and 56, and 58 and 60 as the voltage across the respective series connected resistors 44, 46 and 48 reaches a threshold voltage Vf of the diode, so that the respective diodes becomes forward biased. The parallel combination of a particular forward biased diode and resistor effectively cancels the otherwise biasing resistance value of the particular parallel resistor 44, 46 or 48 to reduce the overall gain of the compression circuit 18.

The transfer function of the compression circuit 18 is set forth as follows in Table I.

TABLE I

| Input limits | Transfer Function |
|---|---|
| Vin<(R1/R2)*Vf | Vo = Vin*[(R2 + R3 + R4)/R1] |
| (R1/R2)*Vf<Vin<(R1/R3)*Vf | Vo = Vin*[(R3 + R4)/R1] + Vf |
| (R1/R3)*Vf<Vin<(R1/R4)*Vf | Vo = Vin*[R4/R1] + 2*Vf |
| (R1/R2)*Vf<Vin | Vo = 3*Vf |

Referring now to FIG. 3, there is shown a flow chart illustrating the logical steps performed by the microprocessor 26 of the signal measurement system 10. First the microprocessor 26 reads the digital word stored in the analog to digital converter 24. Then the read digital value is compared with a stored maximum peak value which is initially zero. When the present read value is greater than the stored maximum peak value, then the present read value is stored as the new maximum peak noise value. Otherwise, when the present read value is less than the previously stored maximum peak value, then the stored maximum peak value is not changed and a next value is read from the A/D converter 24. The above sequential steps are repeated for a predetermined first time interval, for example, such as 1 minute or 15 minutes.

Then the maximum peak value identified during the predetermined first time interval is utilized to identify a corresponding corrected signal value, for example, stored in a look-up table of corrected peak values. The corrected peak value provides digital correction for non-linearities in the compression circuit 18 including the difference between the actual non-linear circuit response of the compression circuit 18 and an ideal linear response. The identified corrected peak value for the predetermined first time interval is then stored in the RAM 28. Then the maximum peak noise value is reset to zero and the sequential operations are repeated for a next predetermined first time interval. Each subsequent identified corrected peak value for each of the next sequential predetermined first time intervals is sequentially stored in the RAM 28.

After a second predetermined time interval equal to an integer number of the first time intervals, for example, such as 8 minutes or 120 minutes, has elapsed then the sequentially stored corrected peak noise values are formatted and loaded into a print buffer in a bit mapped format. The bit mapped noise values are applied together with timing and control signals to the printer 36.

Referring now to FIG. 4, there is shown an exemplary printed noise graph of the signal measurement system 10. The bit mapped noise values are printed with the vertical axis labeled V divided into three logarithmic ranges, as shown, for example including 10 volts, 100 volts and 1,000 volts with a linear scale within each range. The horizontal axis represents time with a printed line resolution corresponding to the predetermined first time interval as described with respect to the sequential operations of FIG. 3. Thus the printed noise graph simply and effectively reports for an extended period of time, the formatted peak noise values verses time values to facilitate easy analysis by the user.

While the invention has been described with reference to details of the illustrated embodiment, these details are not intended to limit the scope of the invention as defined in the appended claims.

I claim:

1. A line noise signal measurement system for measuring noise on lines being monitored, such as AC power lines, comprising:

detecting means coupled to said monitored lines for providing a sensed analog signal of said monitored lines;

compression means coupled to said detecting means for providing an amplitude compressed signal responsive to said sensed analog signal, said compression means having a stepwise substantially linear transfer function responsive to a variable magnitude of said sensed signal; and signal processing means coupled to said compression means for sequentially generating a digital signal representative of said amplitude compressed signal; and digital processing means coupled to said signal processing means for generating a measured noise signal record responsive to said digital signal, said measured signal record generating means including means for identifying the line noise signal.

2. A signal measurement system as recited in claim 1 wherein said compression means comprises an operational amplifier having wide bandwidth and high slew rate characteristics.

3. A signal measurement system as recited in claim 2 wherein said compression means further comprises a plurality of resistance devices connected in series between an input and an output of said operational amplifier and at least one semiconductor switching devices connected in parallel across each of said resistance devices.

4. A signal measurement system as recited in claim 3 wherein sequential ones of said semiconductor devices are biased on responsive to an increased magnitude of said sensed signal and said resistance device having a selected impedance to provide said stepwise variable transfer function having a stepwise decreased gain response.

5. A signal measurement system as recited in claim 2 wherein said compression means further comprises a plurality of resistance devices connected in series and at least one diode connected in parallel across each of said resistance devices.

6. A signal measurement system as recited in claim 1 wherein said signal processing means include rectifier means coupled to said compression means for rectifying said amplitude compressed signal.

7. A signal measurement system as recited in claim 6 wherein said signal processing means include peak detector means coupled to said rectifier means for detecting a peak signal of said rectified amplitude compressed signal.

8. A signal measurement system as recited in claim 7 wherein said signal processing means further includes analog to digital converter means coupled to said peak detector means for converting said peak signal to a digital signal.

9. A signal measurement system as recited in claim 1 wherein said digital processing means includes means for providing digital linearity correction of said compression means.

10. A signal measurement system as recited in claim 1 wherein said digital processing means include program means for identifying a maximum peak signal during a first predetermined time interval.

11. A signal measurement system as recited in claim 10 further comprising input means coupled to said digital processing means for receiving user inputs for said first predetermined time interval.

12. A signal measurement system as recited in claim 10 wherein said program means include means for generating a display, said display including said identified maximum peak signal.

13. A line noise signal measurement system for measuring noise on lines being monitored, such as AC power lines, comprising:
    detecting means coupled to said monitored lines for providing a sensed analog signal of said monitored lines;
    compression means coupled to said detecting means for providing an amplitude compressed signal of said sensed analog signal, said compression means having a stepwise variable transfer function responsive to a variable magnitude of said sensed signal;
    signal processing means coupled to said compression means for sequentially generating a digital signal representative of said amplitude compressed signal; and
    digital processing means coupled to said signal processing means for generating a measured noise signal record responsive to said sequentially generated digital signal, said digital processing means including program means receiving said sequentially generated digital signals for sequentially identifying a maximum peak noise signal for a first predetermined time interval, means for storing each said sequentially identified maximum peak noise signal during a second predetermined time interval and printer means responsive to an elapsed said second predetermined time interval for printing said measured noise signal record, said measured noise signal record generating means including means for identifying the line noise signal.

14. A signal measurement system as recited in claim 13 further comprising input means coupled to said digital processing means for receiving user inputs for said first predetermined time interval.

15. A signal measurement system as recited in claim 13 wherein said measured signal record includes said sequentially identified maximum peak signals for each said first predetermined time interval, and wherein said second predetermined time interval is equal to an integer number of said first predetermined time intervals.

16. A signal measurement system as recited in claim 15 wherein said measured signal record of sequentially identified maximum peak signals are provided within a plurality of logarithmic ranges with a linear scale within each logarithmic range.

17. A signal measurement system as recited in claim 13 wherein said digital processing means includes program means for providing digital linearity correction of said compression means.

18. A line noise signal measurement system for measuring noise on lines being monitored, such as AC power lines, comprising:
    detecting means coupled to said monitored lines for providing a sensed analog signal of said monitored lines;
    compression means coupled to said detecting means for providing an amplitude compressed signal of said sensed analog signal, said compression means having a stepwise variable transfer function responsive to a variable magnitude of said sensed signal;
    signal processing means coupled to said compression means for sequentially generating a digital signal representative of said amplitude compressed signal; and
    digital processing means coupled to said signal processing means for generating a measured noise signal record responsive to said sequentially generated digital signal, said digital processing means including program means receiving said sequentially generated digital signals for sequentially identifying a maximum peak noise signal for a predetermined time interval, means for providing linearity correction for said identified maximum peak noise signals and said measured noise signal record generating means including means for identifying the line noise signal.

* * * * *